(12) United States Patent
McLaury et al.

(10) Patent No.: US 7,636,259 B1
(45) Date of Patent: Dec. 22, 2009

(54) FLASH MEMORY ARRAY WITH INDEPENDENTLY ERASABLE SECTORS

(75) Inventors: Loren McLaury, Hillsboro, OR (US); David Lee Rutledge, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 613 days.

(21) Appl. No.: 11/487,647

(22) Filed: Jul. 17, 2006

(51) Int. Cl.
*G11C 11/34* (2006.01)

(52) U.S. Cl. .............................. 365/185.23; 365/230.06

(58) Field of Classification Search ............ 365/185.23, 365/185.29, 230.06
See application file for complete search history.

(56) References Cited

U.S. PATENT DOCUMENTS

| | | | |
|---|---|---|---|
| 5,185,718 A | 2/1993 | Rinerson et al. | |
| 5,289,053 A * | 2/1994 | Ohtsuka | 365/185.23 |
| 5,349,558 A | 9/1994 | Cleveland et al. | |
| 5,357,475 A | 10/1994 | Hasbun et al. | |
| 6,084,798 A | 7/2000 | Lee | |
| 6,535,430 B2 * | 3/2003 | Ogura et al. | 365/185.23 |
| 6,574,148 B2 * | 6/2003 | Chevallier | 365/185.23 |
| 6,662,263 B1 | 12/2003 | Wong | |
| 6,807,103 B2 | 10/2004 | Cavaleri et al. | |
| 6,909,641 B2 | 6/2005 | Naso et al. | |
| 6,930,927 B2 * | 8/2005 | Pascucci | 365/185.29 |
| 6,965,526 B2 | 11/2005 | Cavaleri et al. | |

OTHER PUBLICATIONS

Cappelletti et al., Flash Memories, 1999, pp. 241-257.
U.S. Appl. No. 11/487,751, Loren McLaury.

* cited by examiner

*Primary Examiner*—Anh Phung
(74) *Attorney, Agent, or Firm*—Haynes and Boone, LLP

(57) ABSTRACT

Systems and methods are disclosed herein to provide a flash memory array with independently erasable sectors. For example, in accordance with an embodiment of the present invention, an integrated circuit includes a multi-sector flash memory array comprising first and second subarrays of flash memory cells. First and second sets of word lines are connected with control gates of the flash memory cells of the first and second subarrays. A first set of row drivers connected with the first set of word lines are adapted to selectively tri-state or drive the first set of word lines with a first voltage. A second set of row drivers connected with the second set of word lines are adapted to selectively tri-state or drive the second set of word lines with the first voltage. A plurality of bitlines are connected with flash memory cells of the first and second subarrays.

20 Claims, 4 Drawing Sheets

FLASH MEMORY ARRAY WITH INDEPENDENTLY ERASABLE SECTORS

TECHNICAL FIELD

The present invention relates generally to electrical circuits and, more particularly, to flash memory.

BACKGROUND

As is well known, flash memory cells are often used for non-volatile storage of data. Large numbers of flash memory cells may be grouped together in an array and provided with associated circuitry to implement a flash memory device. Such flash memory devices may be employed, for example, to store configuration data of a programmable logic device (PLD) such as a field programmable gate array (FPGA), a complex programmable logic device (CPLD), or other device.

Flash memory arrays typically must be erased through a bulk erase operation. In this approach, all flash memory cells of the array are simultaneously provided with appropriate erase voltages which remove stored charges from floating gates of the associated flash memory cells. Unfortunately, this approach does not permit the selective erasing of groups of flash memory cells. As a result, if data values in one group of flash memory cells are to be updated, then all flash memory cells of the array must be erased and reprogrammed. Such processes can be unduly cumbersome to users of flash memory devices.

One approach to providing selective erasing of flash memory cells involves the use of separate flash memory arrays. In this approach, each of the separate flash memory arrays may be bulk erased independently from the others. However, in order to facilitate independent erasure of the arrays, each separate array must be implemented as an independent array with its own associated row driver and bitline decoder circuitry in association with the read and write data paths. This additional circuitry can increase the space required to implement the separate flash memory arrays. In particular, the duplicative bitline decoder and data path circuitry required for each flash memory array can consume significant amounts of integrated circuit area. In many applications, the inefficiencies caused by such space requirements can outweigh benefits gained from the ability to independently erase the separate flash memory arrays.

Accordingly, there is a need for an improved flash memory array structure that provides independently-erasable groups of flash memory cells that overcomes the deficiencies of prior approaches identified above. In particular, for example, there is a need for a flash memory device that provides sector-based erasing without requiring significant integrated circuit area committed to dedicated bitline decoder and data path circuitry.

SUMMARY

In accordance with one embodiment of the present invention, an integrated circuit includes a multi-sector flash memory array comprising: a first subarray of flash memory cells, and a second subarray of flash memory cells; a first set of word lines connected with control gates of the flash memory cells of the first subarray; a first set of row drivers connected with the first set of word lines and adapted to selectively tri-state the first set of word lines or drive the first set of word lines with a first voltage; a second set of word lines connected with control gates of the flash memory cells of the second subarray; a second set of row drivers connected with the second set of word lines and adapted to selectively tri-state the second set of word lines or drive the second set of word lines with the first voltage; and a plurality of bitlines, wherein each bitline is connected with a flash memory cell of the first subarray and a flash memory cell of the second subarray.

In accordance with another embodiment of the present invention, a method of selectively erasing a flash memory array includes providing a multi-sector flash memory array comprising: a first subarray of flash memory cells, and a second subarray of flash memory cells; driving a first set of word lines with a first voltage, wherein the first set of word lines are connected with control gates of the flash memory cells of the first subarray; providing a second voltage to a plurality of erase voltage taps connected with the first and second subarrays; and tri-stating a second set of word lines, wherein the second set of word lines are connected with control gates of the flash memory cells of the second subarray, wherein the flash memory cells of the first subarray but not the second subarray are erased in response to the first and second voltages.

In accordance with another embodiment of the present invention, an integrated circuit includes a multi-sector flash memory array comprising: a first subarray of flash memory cells, and a second subarray of flash memory cells; a first set of word lines connected with control gates of the flash memory cells of the first subarray; a second set of word lines connected with control gates of the flash memory cells of the second subarray; means for selectively tri-stating the first set of word lines or driving the first set of word lines with a first voltage; means for selectively tri-stating the second set of word lines or driving the second set of word lines with a first voltage; and a plurality of bitlines, wherein each bitline is connected with a flash memory cell of the first subarray and a flash memory cell of the second subarray.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

The various techniques disclosed herein are applicable to a wide variety of integrated circuits and applications. As an exemplary implementation, flash memory within a programmable logic device (PLD) will be utilized to illustrate the techniques in accordance with one or more embodiments of the present invention. However, it should be understood that this is not limiting and that the techniques disclosed herein may be implemented as desired, in accordance with one or more embodiments of the present invention, within various types of integrated circuits. Therefore, the techniques may be applied to integrated circuits other than PLDs.

Figure 1:
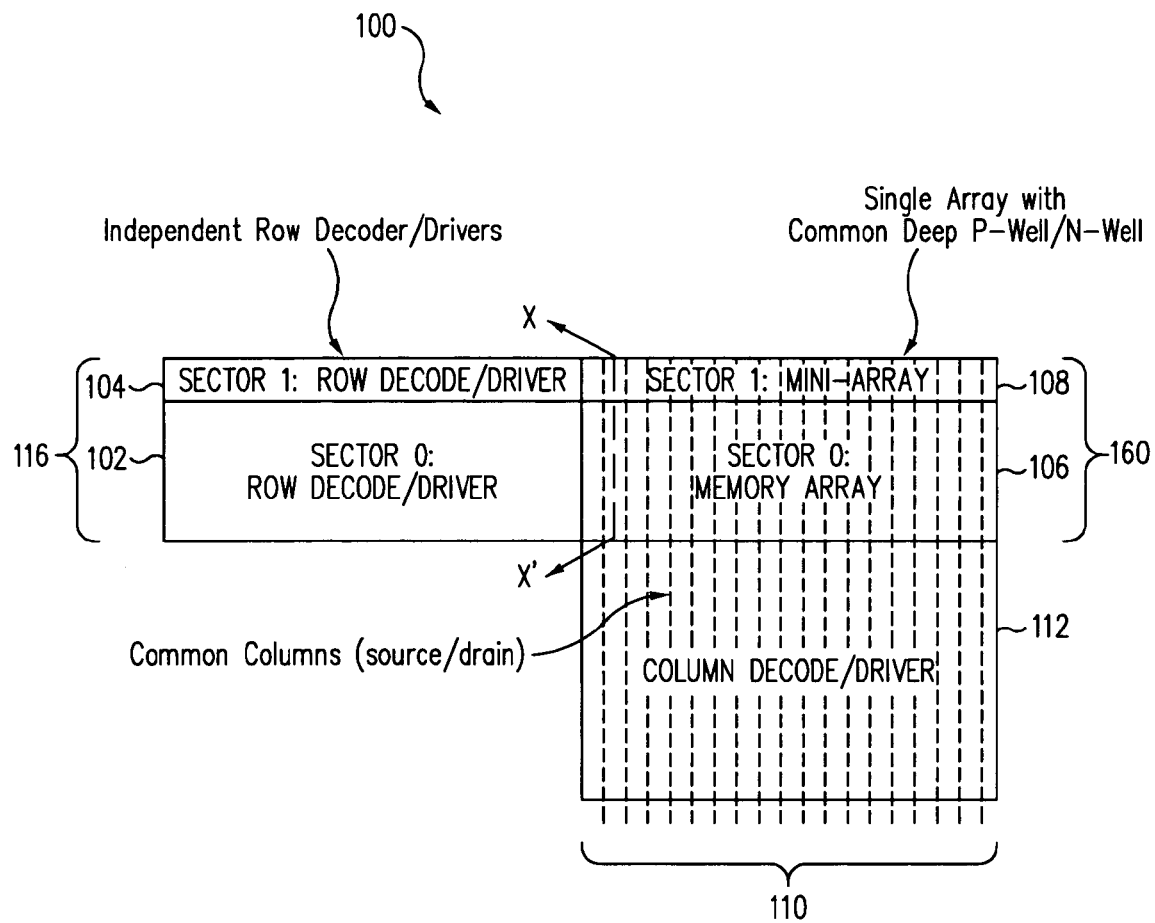
FIGS. 1 and 2 illustrate block diagrams of a flash memory device having independently erasable sectors in accordance with various embodiments of the present invention.

FIG. 1 illustrates a block diagram of a flash memory device 100 having a plurality of independently erasable sectors in accordance with an embodiment of the present invention. Flash memory device 100 may be incorporated into various types of integrated circuits as may be desired for particular applications. For example, in one embodiment, flash memory device 100 may be included as part of a programmable logic device (PLD) and used to store configuration data used to configure operational characteristics of the PLD or other data.

As shown in FIG. 1, flash memory device 100 includes a multi-sector flash memory array 160 which may include a plurality of flash memory cells organized into a plurality of rows and columns. In this regard, flash memory device 100 includes a plurality of bitlines 110 which is connected with appropriate decoder and data path circuitry 112 for reading various data values stored by the flash memory cells.

Flash memory array 160 is further organized into a plurality of subarrays 106 and 108 (i.e., sectors labeled SECTOR 0: MEMORY ARRAY and SECTOR 1: MINI ARRAY, respectively). In this regard, each of subarrays 106 and 108 may be associated with a corresponding sector of flash memory array 160.

Each of subarrays 106 and 108 may be implemented with any desired number of rows and columns. As will be further discussed herein, flash memory cells of subarrays 106 and 108 may share individual bitlines 110, thereby proving space savings within flash memory device 100. In the embodiment of FIG. 1, subarrays 106 and 108 are distinguished by rows of flash memory cells, with a first set of rows being associated with subarray 106, and a second set of rows being associated with subarray 108.

As illustrated, flash memory device 100 further includes row decode/driver circuitry 116. In this regard, each row of subarrays 106 and 108 is associated with a corresponding row driver. For example, a first set of row drivers 102 are connected with the rows of flash memory cells in subarray 106 through a first plurality of word lines, and a second set of row drivers 104 are connected with the rows of flash memory cells in subarray 108 through a second plurality of word lines.

As further described herein, each of row drivers 102 and 104 may be implemented to selectively provide a high negative voltage to their associated word lines while erasing flash memory cells of their associated subarrays 106 and 108, or to alternatively tri-state their associated word lines while another subarray is undergoing an erase operation. As a result, the various subarrays 106 and 108 of flash memory array 160 may be selectively and independently erased.

Figure 2:
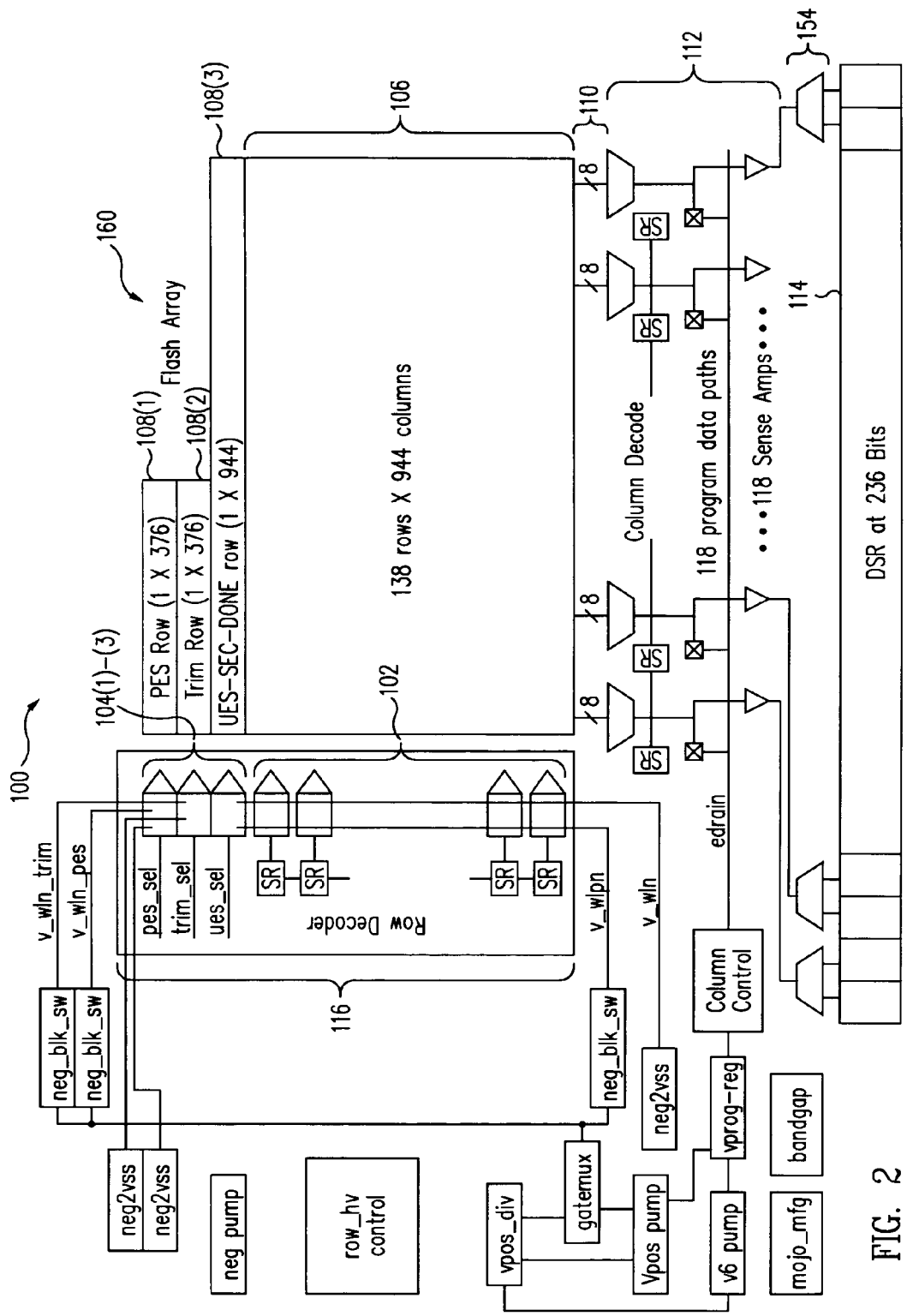

FIG. 2 illustrates another block diagram of flash memory device 100 in accordance with an embodiment of the present invention. In the embodiment of FIG. 2, flash memory array 160 includes additional subarrays in comparison to the embodiment of FIG. 1. In particular, flash memory array 160 includes subarrays 108(1)-(3) as well as subarray 106.

As illustrated, subarrays 108(1) and 108(2) (labeled PES Row and Trim Row, respectively) may each be implemented with one row and 376 columns of flash memory cells. In one embodiment, subarray 108(1) may be used to store program electronic signature (PES) data which may include, for example, test or design data. In another embodiment, subarray 108(2) may be used to store trim data which may include, for example, data for adjusting or trimming various parameters within a PLD such as current source values, resistor values, or other circuit parameters as would be understood by one skilled in the art.

Subarray 108(3) (labeled UES-SEC-DONE row) may be implemented with one row and 944 columns of flash memory cells. Subarray 108(3) may be used to store user electronic signature (UES) data which may include, for example, design and manufacturing data specified by a user. As illustrated, subarrays 108(1)-(3) may each be associated with a corresponding row driver 104(1)-(3) of row decode/driver circuitry 116.

Subarray 106 may be implemented with 138 rows and 944 columns of flash memory cells. Subarray 106 may be used to store, for example, configuration data to be provided to volatile configuration memory (not shown) of a PLD. As illustrated, individual rows of subarray 106 may each be associated with a corresponding one of row drivers 102 of row decode/driver circuitry 116.

Data values may be read from flash memory cells of subarrays 106 and 108(1)-(3) using bitlines 110 and decoder and data path circuitry 112, and may be provided to a register 114 through a plurality of multiplexers 154. Advantageously, subarrays 106 and 108(1)-(3) may be implemented to share bitlines 110. In particular, subarrays 106 and 108(1)-(3) may share bitlines 110 associated with the first 376 columns (i.e., columns 1-376) of flash memory array 160, subarrays 106 and 108(3) may further share bitlines 110 associated with the remaining 568 columns (i.e., columns 377-944).

Figure 3:
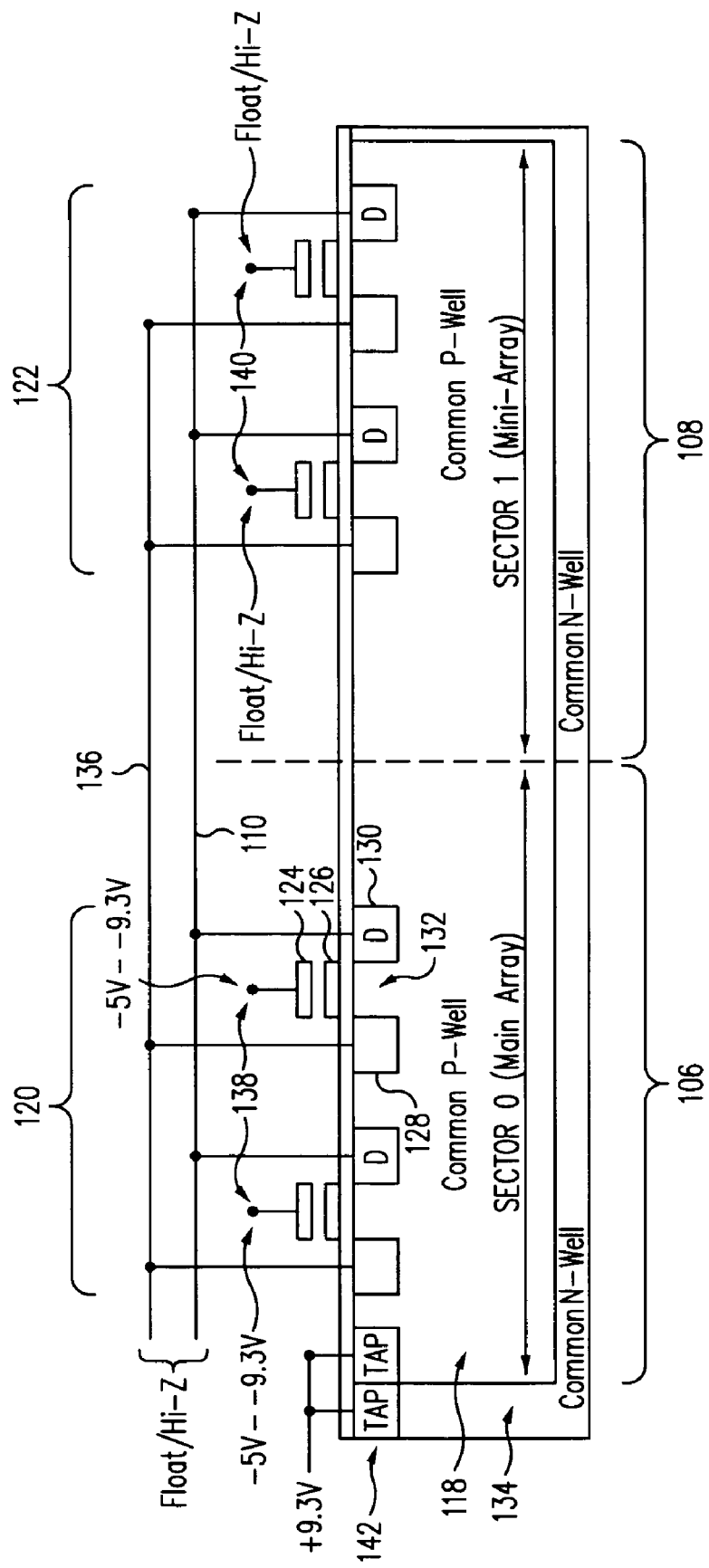
FIG. 3 illustrates a cross-section of a flash memory array of the flash memory device of FIG. 1 during an erase operation in accordance with an embodiment of the present invention.

FIG. 3 illustrates a cross-section of flash memory array 160 of flash memory device 100 taken along line X-X' of FIG. 1 during an erase operation in accordance with an embodiment of the present invention. It will be appreciated that the cross-section of FIG. 3 is taken parallel to bitlines 110 of flash memory device 100 and therefore illustrates various flash memory cells of one column of flash memory array 160 for one exemplary embodiment of flash memory device 100.

As shown in FIG. 3, subarrays 106 and 108 include a plurality of flash memory cells 120 and 122, respectively. Each group of flash memory cells 120 and 122 corresponds to one row of flash memory array 160. Accordingly, it will be appreciated that in the embodiment of FIG. 3, subarrays 106 and 108 are each implemented with two rows. However, any desired number of rows may be used in subarrays 106 and 108.

In the embodiment of FIG. 3, flash memory cells 120 and 122 are implemented in a common P-well 118 which itself is encapsulated by an N-well 134 of a P-type substrate (not shown). However, it will be appreciated that other implementations are also contemplated. For example, in another embodiment, subarrays 106 and 108 may be implemented with separate P-wells (not shown) in N-well 134. In such an embodiment, the separate P-wells may optionally be electrically connected with each other (for example, by metal connections) in order to maintain the P-wells at a common electrical potential.

As shown in FIG. 3, each of flash memory cells 120 and 122 may be implemented with a control gate 124, a floating gate 126, a source 128, a drain 130, and a channel 132. Control gates 124 of flash memory cells 120 and 122 are connected with word lines 138 and 140 which are connected with appropriate row drivers 102 and 104 (see FIG. 1), respectively. For example, word lines 138 may be individually connected with two corresponding row drivers 102, and word lines 140 may be individually connected with two corresponding row drivers 104. As a result, control gates 124 for each of flash memory cells 120 and 122 may be independently driven by row drivers 102 and 104.

Sources 128 and drains 130 of flash memory cells 120 and 122 are connected with a source line 136 and one of bitlines 110. In this regard, it will be appreciated that flash memory cells 120 and 122 of both subarrays 106 and 108 (i.e., sectors 0 and 1) may share source line 136 and bitline 110. As a result, flash memory cells 120 and 122 may share bitline decoder and data path circuitry 112 without requiring additional duplicate circuitry to be provided separately for subarrays 106 and 108.

It will be appreciated that any of flash memory cells 120 and 122 may be erased in accordance with Fowler-Nordhiem tunneling techniques and programmed with channel hot electron techniques by applying appropriate programming or erase voltages to store or remove electrons from floating gates 126. In particular, flash memory cells 120 and 122 may be erased by applying a high positive voltage (for example, in the range of approximately 9.3V to approximately 10V) to P-well 118, while simultaneously applying a high negative voltage (for example, in the range of approximately −5V to approximately −10V) to control gates 124. In this regard, erase voltage taps 142 (i.e., well connections) may be provided to connect a high positive voltage to P-well 118 and N-well 134, and row drivers 102 or 104 may be used to provide a high negative voltage to control gates 124.

As previously described, subarrays 106 and 108 may be optionally implemented with separate P-wells. In such an embodiment, both of the P-wells may be provided with erase voltage taps 142 which are driven with a high positive voltage during an erase operation. By driving both of the P-wells through erase voltage taps 142 even when only one of subarrays 106 and 108 is being erased, certain unintended reverse bias conditions can be prevented. Specifically, when a high positive erase voltage (for example, approximately 9.3V) is applied to a first one of the P-wells, the P-N junction between the first P-well and the source/drains of the flash memory cells in the first P-well becomes forward biased, thereby pulling any shared bitlines 110 and source lines 136 to the high voltage.

As a result, the source/drains of flash memory cells in the second P-well can be driven to a similarly high positive voltage which may cause uncertainty in the operation of flash memory cells in the second P-well, especially if the second P-well is grounded. Accordingly, to reduce this uncertainty, both P-wells as well as their encapsulating N-well 134 may be driven by erase voltage taps 142 during erase operations. For these reasons, N-well 134 is also connected with erase voltage taps 142 for single P-well implementations.

Returning now to the particulars of FIG. 3, control gates 124 for each of flash memory cells 120 and 122 may be independently driven by row drivers 102 and 104. For example, in the embodiment of FIG. 3, control gates 138 of flash memory cells 120 are shown to be provided with an erase voltage in the range of approximately −5V to approximately −9.3V from row drivers 102. At the same time, a high positive voltage of approximately 9.3V is applied to P-well 118 through erase voltage taps 142. As a result, electrons stored in floating gates 126 of flash memory cells 120 can be forced out of floating gates 126 by the high negative and positive voltages.

However, control gates 140 of flash memory cells 122 are shown to be tri-stated (i.e., exhibiting a high impedance or "floating" state) by row drivers 104. Accordingly, word lines 140 and control gates 124 of flash memory cells 122 are permitted to "float" without being "clamped" or otherwise restricted to any particular voltage applied by their corresponding row drivers 104. As a result, the voltage of word lines 140 and control gates 124 of flash memory cells 122 can rise in response to the high positive voltage applied to erase voltage taps 142. For example, in one embodiment, the voltage of "floating" word lines 140 and control gates 124 of flash memory cells 122 may rise to approximately half the voltage applied to erase voltage taps 142 (for example, the voltage may rise to approximately 5V). This tri-stating of word lines 140 and control gates 124 in subarray 108 has the consequence of inhibiting the erasure of flash memory cells 122 (i.e., subarray 108/sector 1) while still permitting the simultaneous erasure of flash memory cells 120 (i.e., subarray 106/sector 0).

Accordingly, by selectively tri-stating or driving word lines 138 and 140 of subarrays 106 and 108, the associated flash memory cells 120 and 122 of subarrays 106 and 108 can be independently erased. As a result, data values stored by one subarray (for example, user data stored by subarray 108) may be maintained (for example, while word lines 140 are tri-stated by row drivers 104) while data values stored by another subarray (for example, configuration data stored by subarray 106) may be erased in preparation for programming with new data (for example, while word lines 138 are driven with a high negative voltage by row drivers 102).

Figure 4:
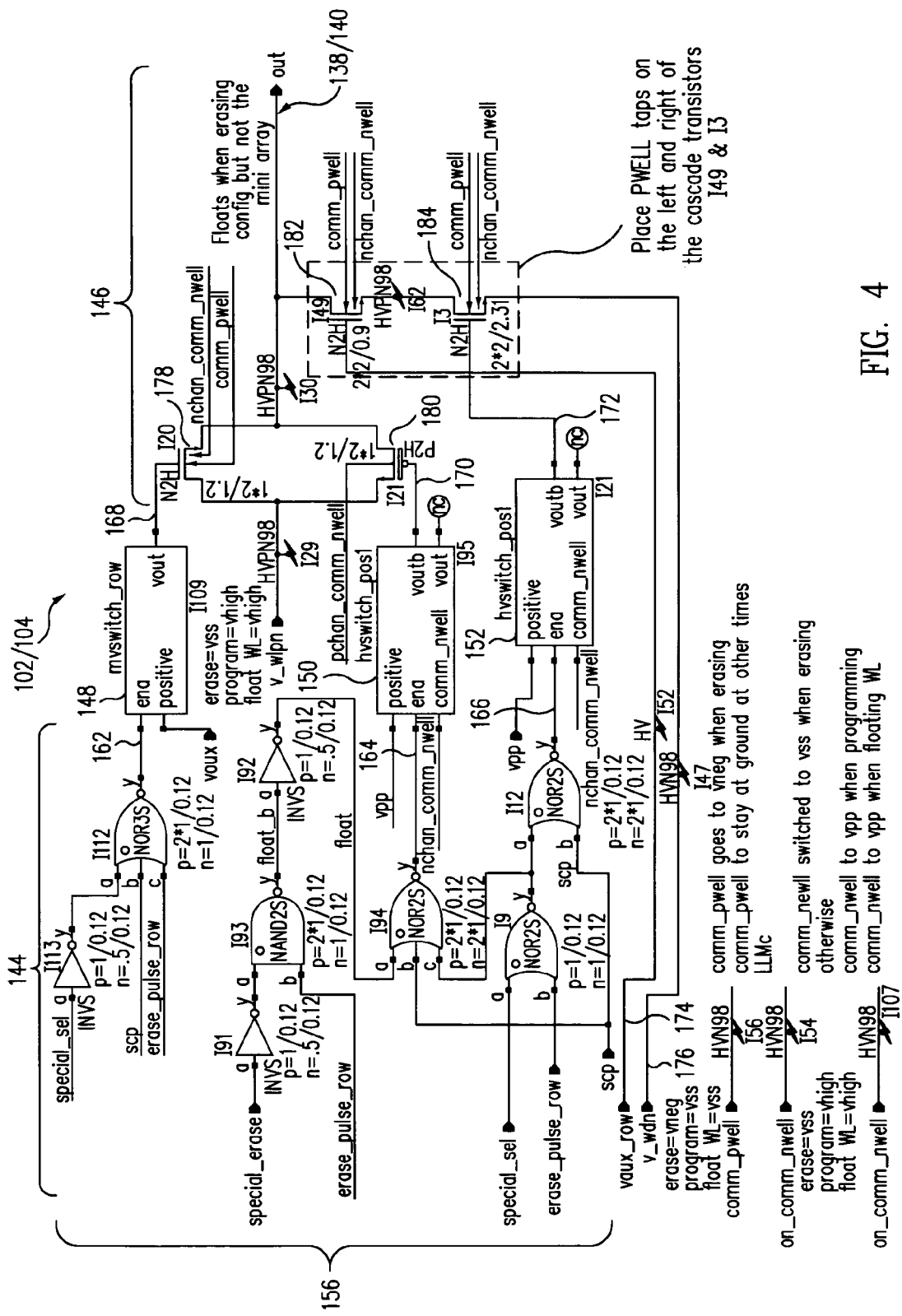
FIG. 4 illustrates a schematic diagram of a row driver of the flash memory device of FIG. 1 in accordance with an embodiment of the present invention.

FIG. 4 illustrates a schematic diagram of one of row drivers 102/104 connected with one of word lines 138/140 in accordance with an embodiment of the present invention. As shown, row driver 102/104 includes various low voltage logic 144 (for example, operating at approximately 1V) which may receive a plurality of low voltage control signals 156, and may provide a plurality of low voltage logic signals 162, 164, and 166 to a plurality of high voltage level translators 148, 150, and 152.

In response to low voltage logic signals 162, 164, and 166, high voltage level translators 148, 150, and 152 provide a plurality of high voltage logic signals 168, 170, and 172 to control the operation of high voltage circuitry 146 (for example, operating in a range of approximately 0V to approximately 10V). For example, a logical low state or a logical high state received from one of low voltage logic signals 162, 164, or 166 may correspond to approximately 0V (i.e., ground) or approximately 10V, respectively, provided by a corresponding one of high voltage logic signals 168, 170, or 172, respectively.

As illustrated, high voltage circuitry 146 includes transistors 178 and 180 connected with word line 138/140. Word line 138/140 is also connected with a pair of cascoded transistors 182 and 184 as shown, which are used to couple word lines 138/140 to a high voltage signal 176 (labeled v_wdn).

Additional high voltage signals 174 and 176 may be provided to further control high voltage circuitry 146. In particular, high voltage signal 174 may transition between approximately 3.3V and ground to selectively turn on and off transistor 182. High voltage signal 176 may transition between ground and approximately −10V to selectively provide a negative voltage to a drain of transistor 184.

In one embodiment, various signals and voltages of FIG. 4 may be implemented in accordance with the following Table 1:

TABLE 1

| SIGNAL | DESCRIPTION |
|---|---|
| Vaux | 3.3 volt supply |
| special_erase | signal to select row for erase |
| special_sel | signal to select row for read/program |
| erase_pulse_row | erase timing signal |

TABLE 1-continued

| SIGNAL | DESCRIPTION |
|---|---|
| scp | self convergent program signal |
| V_wlpn | positive word line reference source |
| v_wdn (176) | negative and ground word line reference |
| vaux_row (174) | 3.3 volt cascode bias and switches to Vss |
| comm_pwell | P-well for N-channel cascode devices |
| nchan_comm_nwell & pchan_comm_nwell | N-well for P-channel and encapsulating N-well |

It will be appreciated that by providing appropriate low voltage control signals 156 and high voltage signals 174 and 176, word line 138/140 may be selectively tri-stated or provided with appropriate voltages for erasing, programming, or reading flash memory cells in its associated sector. For example, in one embodiment, the various modes of operation for row driver 102/104 can be implemented in accordance with the following Table 2:

TABLE 2

| SIGNAL | MODE | | | | | |
|---|---|---|---|---|---|---|
|  | STANDBY | READ | PROGRAM | ERASE | TRI-STATE | SCP |
| erase_pulse_row | 0 | 0 | 0 | 1 | 1 | 0 |
| special_sel | 0 | 1 | 1 | X | 0 | X |
| special_erase | 0 | 0 | 0 | 1 | 0 | 0 |
| v_wdn | 0 | 0 | 0 | VNEG | 0 | 0.3 V |
| vaux_row | 3.3 V | 3.3 V | 3.3 V | 0 | 0 | 3.3 V |
| v_wlpn | 4.6 V | 4.6 V | 4.6 V | VNEG | 0 | 0 |
| comm_pwell | 0 | 0 | 0 | VNEG | 0 | 0 |
| comm_nwell | VPP | VPP | VPP | 0 | VPP | VPP |
| scp | 0 | 0 | 0 | 0 | 0 | 1 |
| transistor 178 gate | 0 | VPP | VPP | 0 | 0 | 0 |
| transistor 184 gate | 0 | 0 | 0 | 0 | 0 | VPP |
| transistor 180 gate | VPP | 0 | 0 | 0 | VPP | VPP |
| word line 102/104 output | 0 | 4.6 v | VPP | VNEG | TRI-STATE | 0.3 V |

In the embodiment shown in Table 2 above, VPP is approximately 9.3V and VNEG is approximately −9.3V. In addition, comm_nwell is provided for both the nchan_comm_nwell and pchan_comm_nwell signals illustrated in FIG. 4. In view of Table 2 above, it will be appreciated that row driver 102/104 may be used to selectively tri-state or drive word line 138/140 with appropriate voltages for various standby, read, program, erase, or SCP (self-convergent programming to remove over-erasures of flash memory cells) modes of operation. In particular, by independently operating each of row drivers 102 and 104, different subarrays 106 and 108 of flash memory device 100 may be selectively erased.

In view of the present disclosure, it will be appreciated that an improved flash memory device implementation as set forth herein allows individual subarrays of a flash memory array to be independently erased, without requiring extensive additional circuitry. For example, flash memory cells provided in different subarrays (i.e., sectors) can be implemented to share a common bitline, thereby reducing duplicative bitlines and bitline decoder and data path circuitry. As a result, the requisite integrated circuit area used by the flash memory device can be reduced.

Embodiments described above illustrate but do not limit the invention. It should also be understood that numerous modifications and variations are possible in accordance with the principles of the present invention. Accordingly, the scope of the invention is defined only by the following claims.

We claim:

1. An integrated circuit comprising:
   a multi-sector flash memory array comprising:
      a first subarray of flash memory cells, and
      a second subarray of flash memory cells;
   a first set of word lines connected with control gates of the flash memory cells of the first subarray;
   a first set of row drivers connected with the first set of word lines and adapted to selectively tri-state the first set of word lines or drive the first set of word lines with a first voltage;
   a second set of word lines connected with control gates of the flash memory cells of the second subarray;
   a second set of row drivers connected with the second set of word lines and adapted to selectively tri-state the second set of word lines or drive the second set of word lines with the first voltage; and
   a plurality of bitlines, wherein each bitline is connected with a flash memory cell of the first subarray and a flash memory cell of the second subarray.

2. The integrated circuit of claim 1, further comprising a plurality of decoders associated with the bitlines, wherein each decoder is adapted to read data values stored by flash memory cells of the first and second subarrays.

3. The integrated circuit of claim 1, wherein the first voltage is in a range of approximately −5V to approximately −10V.

4. The integrated circuit of claim 1, further comprising a plurality of erase voltage taps connected with the first and second subarrays and adapted to receive a second voltage in a range of approximately 9.3V to approximately 10V.

5. The integrated circuit of claim 1, wherein the flash memory cells of the first and second subarrays are implemented together in a common P-well encapsulated by an N-well.

6. The integrated circuit of claim 1, wherein the flash memory cells of the first and second subarrays are implemented in separate P-wells encapsulated by an N-well.

7. The integrated circuit of claim 1, wherein each of the row drivers comprises:
   a plurality of high voltage level translators adapted to provide a plurality of high voltage logic signals in response to a plurality of low voltage logic signals; and a plurality of high voltage transistors adapted to selectively tri-state one of the word lines or drive the word line with the first voltage in response to the high voltage logic signals.

8. The integrated circuit of claim 1, wherein the flash memory cells of the first subarray are adapted to store a first type of data, and the flash memory cells of the second subarray are adapted to store a second type of data.

9. The integrated circuit of claim 1, further comprising:
a third subarray of flash memory cells of the multi-sector flash memory array;
a third set of word lines connected with control gates of the flash memory cells of the third subarray; and
a third set of row drivers connected with the third set of word lines and adapted to drive the third set of word lines with the first voltage.

10. The integrated circuit of claim 1, wherein the integrated circuit is a programmable logic device (PLD).

11. A method of selectively erasing a flash memory array, the method comprising:
providing a multi-sector flash memory array comprising:
a first subarray of flash memory cells, and
a second subarray of flash memory cells;
driving a first set of word lines with a first voltage, wherein the first set of word lines are connected with control gates of the flash memory cells of the first subarray;
providing a second voltage to a plurality of erase voltage taps connected with the first and second subarrays; and
tri-stating a second set of word lines, wherein the second set of word lines are connected with control gates of the flash memory cells of the second subarray, wherein the flash memory cells of the first subarray but not the second subarray are erased in response to the first and second voltages.

12. The method of claim 11, wherein the first voltage is in a range of approximately −5V to approximately −10V.

13. The method of claim 11, wherein the second voltage is in a range of approximately 9.3V to approximately 10V.

14. The method of claim 11, wherein the flash memory cells of the first and second subarrays are implemented together in a common P-well encapsulated by an N-well, wherein the erase voltage taps are connected with the common P-well and the N-well.

15. The method of claim 11, wherein the flash memory cells of the first and second subarrays are implemented in separate P-wells encapsulated by an N-well, wherein the erase voltage taps are connected with the separate P-wells and the N-well.

16. The method of claim 11, wherein the first and second subarrays are connected by a plurality of bitlines, wherein the method further comprises:
reading a first data value stored by a flash memory cell of the first subarray using one of the bitlines; and
reading a second data value stored by a flash memory cell of the second subarray using the one of the bitlines.

17. The method of claim 11, wherein the driving and the tri-stating are performed by a plurality of row drivers associated with the first and second sub-arrays.

18. An integrated circuit comprising:
a multi-sector flash memory array comprising:
a first subarray of flash memory cells, and
a second subarray of flash memory cells;
a first set of word lines connected with control gates of the flash memory cells of the first subarray;
a second set of word lines connected with control gates of the flash memory cells of the second subarray;
means for selectively tri-stating the first set of word lines or driving the first set of word lines with a first voltage;
means for selectively tri-stating the second set of word lines or driving the second set of word lines with a first voltage; and
a plurality of bitlines, wherein each bitline is connected with a flash memory cell of the first subarray and a flash memory cell of the second subarray.

19. The integrated circuit of claim 18, wherein the first voltage is in a range of approximately −5V to approximately −10V.

20. The integrated circuit of claim 18, further comprising a plurality of erase voltage taps connected with the first and second subarrays and adapted to receive a second voltage in a range of approximately 9.3V to approximately 10V.

* * * * *

UNITED STATES PATENT AND TRADEMARK OFFICE
CERTIFICATE OF CORRECTION

| | | |
|---|---|---|
| PATENT NO. | : 7,636,259 B1 | Page 1 of 1 |
| APPLICATION NO. | : 11/487647 | |
| DATED | : December 22, 2009 | |
| INVENTOR(S) | : Loren McLaury and David Lee Rutledge | |

It is certified that error appears in the above-identified patent and that said Letters Patent is hereby corrected as shown below:

On the cover page, item (73), change the name of the Assignee from "Lallice Semiconductor Corporation" to --Lattice Semiconductor Corporation--.

Signed and Sealed this
Seventeenth Day of January, 2012

David J. Kappos
*Director of the United States Patent and Trademark Office*